(12) United States Patent
Mahajan et al.

(10) Patent No.: US 10,068,852 B2
(45) Date of Patent: Sep. 4, 2018

(54) INTEGRATED CIRCUIT PACKAGE WITH EMBEDDED BRIDGE

(71) Applicant: Intel Corporation, Santa Clara, CA (US)

(72) Inventors: Ravindranath V. Mahajan, Chandler, AZ (US); Christopher J. Nelson, Gilbert, AZ (US); Omkar G. Karhade, Chandler, AZ (US); Feras Eid, Chandler, AZ (US); Nitin A. Deshpande, Chandler, AZ (US); Shawna M. Liff, Scottsdale, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/636,117

(22) Filed: Jun. 28, 2017

(65) Prior Publication Data

US 2017/0301625 A1 Oct. 19, 2017

Related U.S. Application Data

(60) Continuation of application No. 15/004,774, filed on Jan. 22, 2016, now Pat. No. 9,716,067, which is a
(Continued)

(51) Int. Cl.
*H01L 23/538* (2006.01)
*H01L 25/065* (2006.01)
(Continued)

(52) U.S. Cl.
CPC ...... *H01L 23/5381* (2013.01); *H01L 23/3114* (2013.01); *H01L 23/3675* (2013.01); *H01L 25/0657* (2013.01)

(58) Field of Classification Search
CPC ............... H01L 25/042; H01L 25/0652; H01L 25/0655; H01L 25/071; H01L 25/072;
(Continued)

(56) References Cited

U.S. PATENT DOCUMENTS 5,847,998 A 12/1998 Van Buskirk
6,972,152 B2 12/2005 Taggert et al.
(Continued)

FOREIGN PATENT DOCUMENTS

CN 101930956 A 12/2010
CN 101331812 B 2/2011
(Continued)

OTHER PUBLICATIONS

Notice of Allowance dated Jun. 20, 2016 for U.S. Appl. No. 14/368,721, 10 pages.
(Continued)

*Primary Examiner* — Shahed Ahmed
(74) *Attorney, Agent, or Firm* — Schwabe, Williamson & Wyatt, P.C.

(57) ABSTRACT

Embodiments of the present disclosure are directed towards an integrated circuit (IC) package having first and second dies with first and second input/output (I/O) interconnect structures, respectively. The IC package may include a bridge having first and second electrical routing features coupled to a portion of the first and second I/O interconnect structures, respectively. In embodiments, the first and second electrical routing features may be disposed on one side of the bridge; and third electrical routing features may be disposed on an opposite side. The first and second electrical routing features may be configured to route electrical signals between the first die and the second die and the third electrical routing features may be configured to route electrical signals between the one side and the opposite side. The
(Continued)

first die, the second die, and the bridge may be embedded in electrically insulating material. Other embodiments may be described and/or claimed.

19 Claims, 7 Drawing Sheets

Related U.S. Application Data division of application No. 14/132,774, filed on Dec. 18, 2013, now Pat. No. 9,275,955.

(51) Int. Cl.
*H01L 23/367* (2006.01)
*H01L 23/31* (2006.01)

(58) Field of Classification Search
CPC ............. H01L 25/0753; H01L 25/115; H01L 23/5381; H01L 23/367; H01L 25/50; H01L 24/19; H01L 2224/24145; H01L 2224/24245; H01L 2924/1434; H01L 2924/1432
USPC ........ 257/796, 787, 707, 774; 438/122, 106, 438/618
See application file for complete search history.

(56) References Cited

U.S. PATENT DOCUMENTS

| | | | |
|---|---|---|---|
| 8,064,224 | B2 | 11/2011 | Mahajan et al. |
| 8,127,979 | B1 | 3/2012 | Wu et al. |
| 8,441,809 | B2 | 5/2013 | Mahajan et al. |
| 8,519,543 | B1 | 8/2013 | Song et al. |
| 8,878,354 | B1 | 11/2014 | Patel |
| 2004/0178488 | A1 | 9/2004 | Bolken et al. |
| 2006/0220167 | A1 | 10/2006 | Min et al. |
| 2006/0226527 | A1 | 10/2006 | Hatano et al. |
| 2007/0023910 | A1 | 2/2007 | Beddingfield |
| 2007/0023921 | A1 | 2/2007 | Zingher et al. |
| 2007/0096292 | A1 | 5/2007 | Machida |
| 2008/0210459 | A1 | 9/2008 | Lin |
| 2009/0089466 | A1 | 4/2009 | Cunningham et al. |
| 2009/0244874 | A1 | 10/2009 | Mahajan et al. |
| 2009/0321939 | A1* | 12/2009 | Chandrasekaran ..... H01L 24/73 257/758 |
| 2010/0088452 | A1* | 4/2010 | Morein ............... G06F 13/4031 710/306 |
| 2010/0288541 | A1 | 11/2010 | Appelt et al. |
| 2010/0288549 | A1 | 11/2010 | Chiang et al. |
| 2010/0327424 | A1 | 12/2010 | Braunisch et al. |
| 2011/0147933 | A1 | 6/2011 | Wu et al. |
| 2011/0215472 | A1 | 9/2011 | Chandrasekaran |
| 2011/0042824 | A1 | 11/2011 | Koide |
| 2012/0193812 | A1 | 8/2012 | Toh et al. |
| 2013/0003309 | A1 | 1/2013 | Stella |
| 2013/0168854 | A1 | 7/2013 | Karikalan et al. |
| 2013/0168860 | A1 | 7/2013 | Karikalan et al. |
| 2013/0277855 | A1 | 10/2013 | Kang et al. |
| 2013/0320547 | A1 | 12/2013 | Zhang et al. |
| 2013/0320565 | A1 | 12/2013 | Griswold |
| 2014/0091474 | A1 | 4/2014 | Starkston et al. |
| 2014/0145331 | A1 | 5/2014 | Hwang et al. |
| 2014/0177625 | A1* | 6/2014 | Chang ..................... G02B 6/43 370/351 |
| 2014/0189227 | A1 | 7/2014 | Choi |
| 2014/0210097 | A1 | 7/2014 | Chen et al. |
| 2014/0321087 | A1 | 10/2014 | Zhang |
| 2015/0116965 | A1* | 4/2015 | Kim ................... H01L 23/5383 361/767 |
| 2015/0318236 | A1 | 11/2015 | Zhang et al. |

FOREIGN PATENT DOCUMENTS

| | | |
|---|---|---|
| CN | 102148206 A | 8/2011 |
| JP | 2003008228 A | 1/2003 |
| JP | 2005163153 A | 6/2005 |
| JP | 2005213600 A | 8/2005 |
| JP | 2010219530 A | 9/2010 |
| JP | 2013105908 A | 5/2013 |
| JP | 2013110443 A | 6/2013 |
| JP | 2013138115 A | 7/2013 |
| KR | 1020130112084 A | 10/2013 |
| WO | WO2013095405 A1 | 6/2013 |

OTHER PUBLICATIONS

International Search Report and Written Opinion dated Jul. 24, 2014 for International Application No. PCT/US2013/065246, 13 pages.
Examination Report dated Apr. 22, 2015 for United Kingdom Application No. GB1420296.4, 6 pages.
Non-Final Office Action dated Jun. 11, 2015 for U.S. Appl. No. 14/132,774, 18 pages.
Examination Report dated Oct. 30, 2015 for United Kingdom Application No. GB1420296.4, 2 pages.
Notice of Allowance dated Nov. 4, 2015 for U.S. Appl. No. 14/132,774, 17 pages.
Examination Report dated Jan. 29, 2016 for United Kingdom Application No. GB1420296.4, 2 pages.
Non-Final Office Action dated Mar. 1, 2016 for U.S. Appl. No. 14/368,721, 15 pages.
Qinglei Zhang et al., "Integrated Circuit Package Substrate", U.S. Appl. No. 15/260,099, filed Sep. 8, 2016, 28 pages.
Examination Report dated Aug. 16, 2016 for United Kingdom Application No. GB1420296.4, 2 pages.
Office Action dated Sep. 8, 2016 for Korean Application No. 2016-7006749, 15 pages.
Extended European Search Report dated Apr. 21, 2017 for European Patent Application No. 13895610.7, 7 pages.
Non-Final Office Action dated Apr. 7, 2017 for U.S. Appl. No. 15/260,099, 25 pages.
Notice of Allowance dated Aug. 2, 2017 for U.S. Appl. No. 15/260,099, 19 pages.
Non-Final Office Action dated Aug. 23, 2016 for U.S. Appl. No. 15/004,774, 24 pages.
Final Office Action dated Dec. 27, 2016 for U.S. Appl. No. 15/004,774, 27 pages.
Notice of Allowance dated Mar. 17, 2017 for U.S. Appl. No. 15/004,774, 11 pages.
Office Action dated Dec. 12, 2017 for Japanese Application No. 2016-545727, 14 pages.
Non-Final Office Action dated May 31, 2018 for U.S. Appl. No. 15/813,866, 26 pages.

* cited by examiner

INTEGRATED CIRCUIT PACKAGE WITH EMBEDDED BRIDGE

CROSS REFERENCE TO RELATED APPLICATIONS

The present Application is a continuation application of U.S. patent application Ser. No. 15/004,774, which is a division of U.S. patent application Ser. No. 14/132,774, entitled "INTEGRATED CIRCUIT PACKAGE WITH EMBEDDED BRIDGE," filed Dec. 18, 2013, and now U.S. Pat. No. 9,275,955, the disclosures of which are hereby incorporated by reference herein in their entireties for all purposes.

FIELD

Embodiments of the present disclosure generally relate to the field of integrated circuits, and more particularly, to an integrated circuit package having an embedded bridge.

BACKGROUND

The input/output density of dies, such as processors, is continually increasing. Integration of multiple dies on a package with high interconnect densities is important to achieve high computational abilities. High density interconnect technologies like silicon interposers are expensive due to the large silicon area. Interconnect bridges embedded in substrates use less silicon than silicon interposers do.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
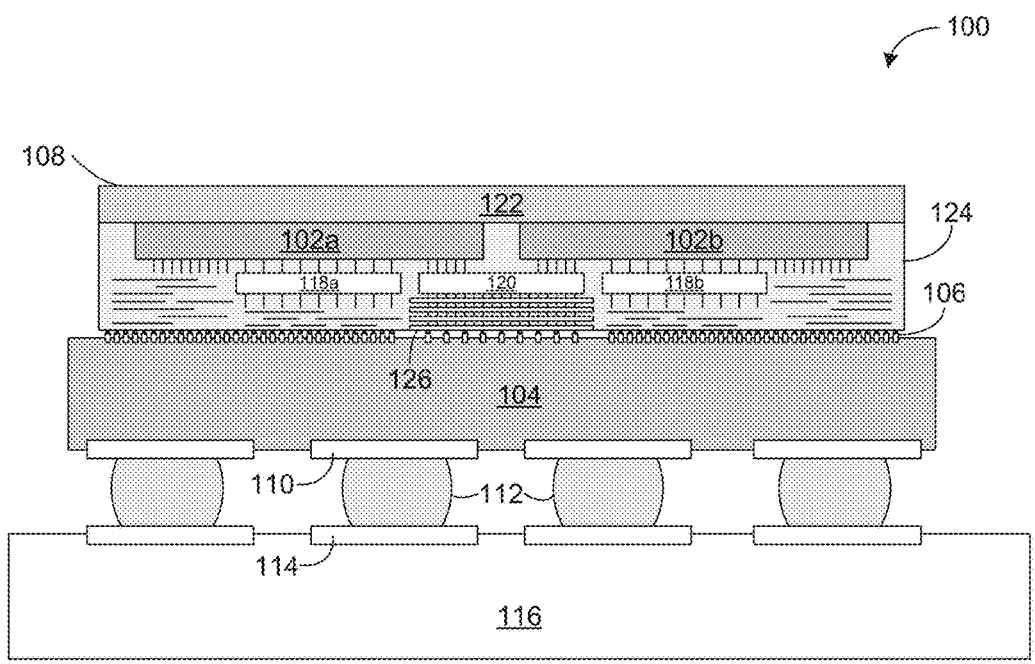
FIG. 1 schematically illustrates a cross-section side view of an example integrated circuit (IC) assembly, in accordance with some embodiments of the present disclosure.

Embodiments of the present disclosure describe techniques and configurations for integrated circuit packages having an embedded bridge. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100. In some embodiments, the IC assembly 100 may include an IC package 108 having dies 102a and 102b (hereinafter "dies 102"), power management modules 118a and 118b (hereinafter "power management modules 118"), and one or more bridges 120. In some embodiments, bridge 120 may be electrically coupled with one or more additional dies 126. In some embodiments, IC package 108 may also include heat spreader 122.

The IC package 108 may be electrically and physically coupled with package substrate 104, as depicted. The package substrate 104 may further be electrically and physically coupled with a circuit board 116, as depicted. The IC package 108 is discussed in further detail in reference to FIGS. 2-8, below.

The IC package 108 may be attached to the package substrate 104 according to a variety of suitable configurations including, a flip configuration, as depicted, or other configurations such as, for example, being embedded in the package substrate 104 or being configured in a wirebonding arrangement. In the flip configuration, the IC package 108 may be attached to a surface of the package substrate 104 using die interconnect structures 106 such as bumps, pillars, or other suitable structures that may also electrically couple the IC package 108 with the package substrate 104.

The IC package 108 may represent a discrete chip made from a semiconductor material and may be, include, or be a part of a processor, memory, or ASIC in some embodiments. In some embodiments, an electrically insulative material 124 such as, for example, molding compound or underfill material, may encapsulate a portion of the IC package 108 and/or interconnect structures 106. The die interconnect structures 106 may be configured to route the electrical signals between the IC package 108 and the package substrate 104.

The package substrate 104 may include electrical routing features (not depicted) configured to route electrical signals to or from IC package 108. The electrical routing features may include, for example, traces disposed on one or more surfaces of the package substrate 104 and/or internal routing features such as, for example, trenches, vias or other interconnect structures to route electrical signals through the package substrate 104.

In some embodiments, the package substrate 104 may be an epoxy-based laminate substrate having a core and/or build-up layers such as, for example, an Ajinomoto Build-up Film (ABF) substrate. The package substrate 104 may include other suitable types of substrates in other embodiments including, for example, substrates formed from glass, ceramic, or semiconductor materials.

The circuit board 116 may be a printed circuit board (PCB) composed of an electrically insulative material such as an epoxy laminate. For example, the circuit board 116 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not depicted), such as vias, may be formed through the electrically insulating layers to route the electrical signals of the dies 102 through the circuit board 116. The circuit board 116 may be composed of other suitable materials in other embodiments. In some embodiments, the circuit board 116 may be a motherboard (e.g., motherboard 802 of FIG. 8).

Package-level interconnects such as, for example, solder balls 112 or land-grid array (LGA) structures may be coupled to one or more lands (hereinafter "lands 110") on the package substrate 104 and one or more pads 114 on the circuit board 116 to form corresponding solder joints that are configured to further route the electrical signals between the package substrate 104 and the circuit board 116. Other suitable techniques to physically and/or electrically couple the package substrate 104 with the circuit board 116 may be used in other embodiments. In some embodiments (not depicted), IC package 108 may be coupled with circuit board 116, for example, in the same manner that IC package 108 is coupled with the package substrate 104. In such embodiments, package substrate 104 may be omitted.

Figure 2:
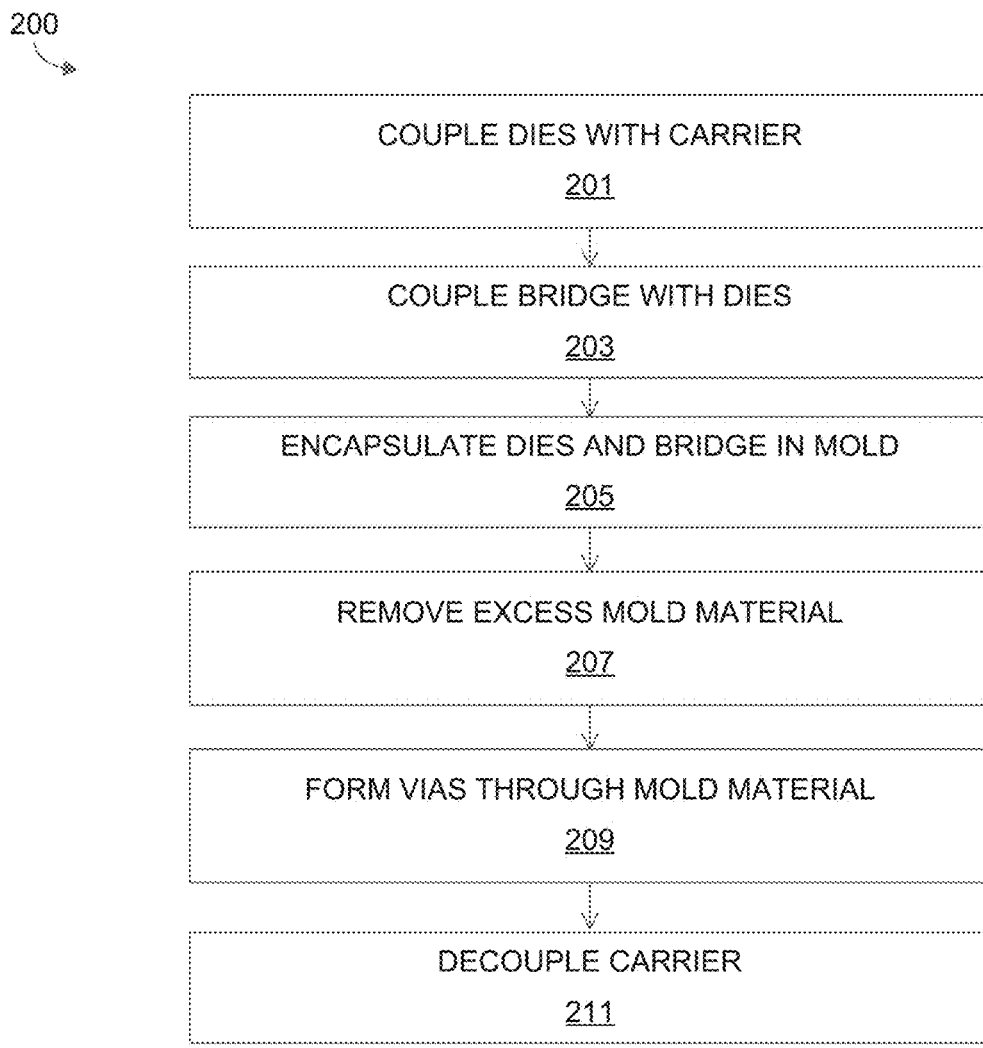
FIG. 2 is an illustrative flow diagram of an integrated circuit package fabrication process in accordance with some embodiments of the present disclosure.
Figure 3:
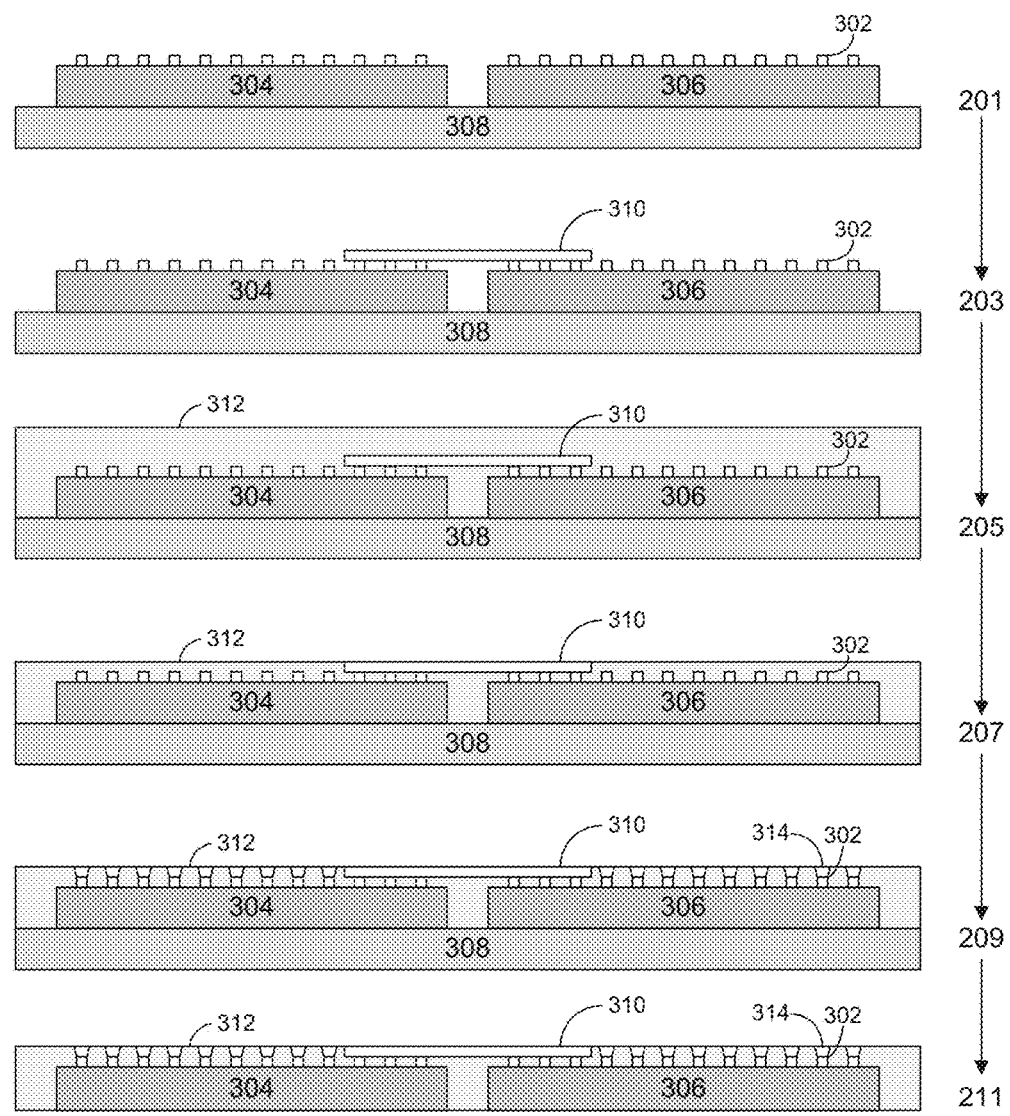
FIG. 3 is an illustrative cross-sectional view of selected operations illustrating stages in the integrated circuit package fabrication process described in FIG. 2, in accordance with an embodiment of the present disclosure.

FIG. 2 is an illustrative flow diagram of an integrated circuit package fabrication process in accordance with some embodiments of the present disclosure. FIG. 3 provides cross-sectional views of selected operations illustrating stages in the IC package substrate fabrication process 200, in accordance with an illustrative embodiment. As a result, FIG. 2 and FIG. 3 will be described in conjunction with one another. To aid in this description, the operations performed in FIG. 2 are referenced on the arrows moving from operation to operation in FIG. 3.

Process 200 may begin at operation 201 where two or more dies (e.g., dies 304 and 306 of FIG. 3) may be coupled with a carrier (e.g., carrier 308 of FIG. 3). The dies 304 and 306 may be coupled with the carrier 308 by way of a bonding material (not depicted), such as, for example, an adhesive, resin, or solder. An adhesive may be any type of die bonding adhesive, such as an epoxy adhesive. In some embodiments, an adhesive may include metal particles suspended in the adhesive to provide for thermal and or electrical conductivity. A resin may be, for example, a polyimide based resin or a thermoplastic. Solder may include, but is not limited to, lead (Pb), gold (Au), silver (Ag), tin (Sn), indium (In), antimony (Sb), bismuth (Bi), or any combination thereof. In some embodiments, the material bonding the dies to the carrier may be selected to make debonding of the dies from the carrier more easily accomplished than with other materials.

In embodiments, the carrier 308 may be a metal carrier configured to perform as a heat spreader for the IC package. Such a metal carrier may be selected based upon the material's thermal conductivity and may include any material capable of allowing sufficient heat transfer away from dies 304 and 306 to allow dies 304 and 306 to maintain an operational temperature while voltage is applied. For example, the metal carrier may be made at least in part of copper or copper alloy, aluminum or aluminum alloy, AlSiC (aluminum matrix with silicon carbide particles), diamond, copper-tungsten pseudoalloy, Dymalloy. In other embodiments, the carrier 308 may be selected due to its coefficient of expansion to reduce or minimize expansion differences in the process flow. In such embodiments, the carrier 308 may be, for example, a glass or ceramic carrier.

In some embodiments, die 304 or 306 may be coupled with the carrier 308 prior to the other die being coupled with the carrier 308. In such embodiments, the second die (e.g., die 306) may be coupled with the carrier 308 in a location with respect to the location of the first die (e.g., die 304) coupled with the carrier. Dies 304 and 306 may each represent a discrete chip made from a semiconductor material. Such dies 304 and 306 may be, include, or be a part of a processor, memory, or ASIC in some embodiments. While only two dies are depicted, this is merely for clarity and any suitable number of dies may be coupled with the carrier without departing from the scope of this disclosure.

In operation 203 a bridge (e.g., bridge 310 of FIG. 3) may be attached to dies 304 and 306. In embodiments, bridge 310 may include electrical routing features configured to attach to and route signals to and from dies 304 and 306. The electrical routing features may be configured to attach to dies 304 and 306 according to a variety of suitable configurations including, a flip-chip configuration. In the flip-chip configuration, bridge 310 may be attached to one or both of dies 304 or 306 using die interconnect structures 302, also referred to herein as input/output (I/O) interconnect structures, such as bumps, pillars, or other suitable structures that may also electrically couple bridge 310 with dies 304 and 306. In embodiments where more than two dies are utilized, the electrical routing features of the bridge may be configured to attach to and route signals to and from each additional die in addition to dies 304 and 306. For instance, in one example configuration, not depicted, bridge 310 may be attached to interconnect structures, such as interconnect structures 302, disposed on the corners of four dies such that the bridge physically and electrically couples the four dies together.

Figure 4:
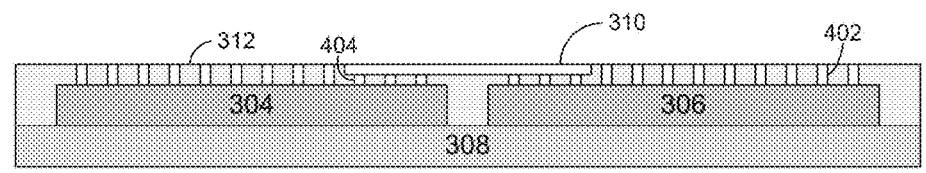
FIG. 4 is an illustrative cross-sectional view of an integrated circuit package according to some embodiments of the present disclosure.
Figure 5:
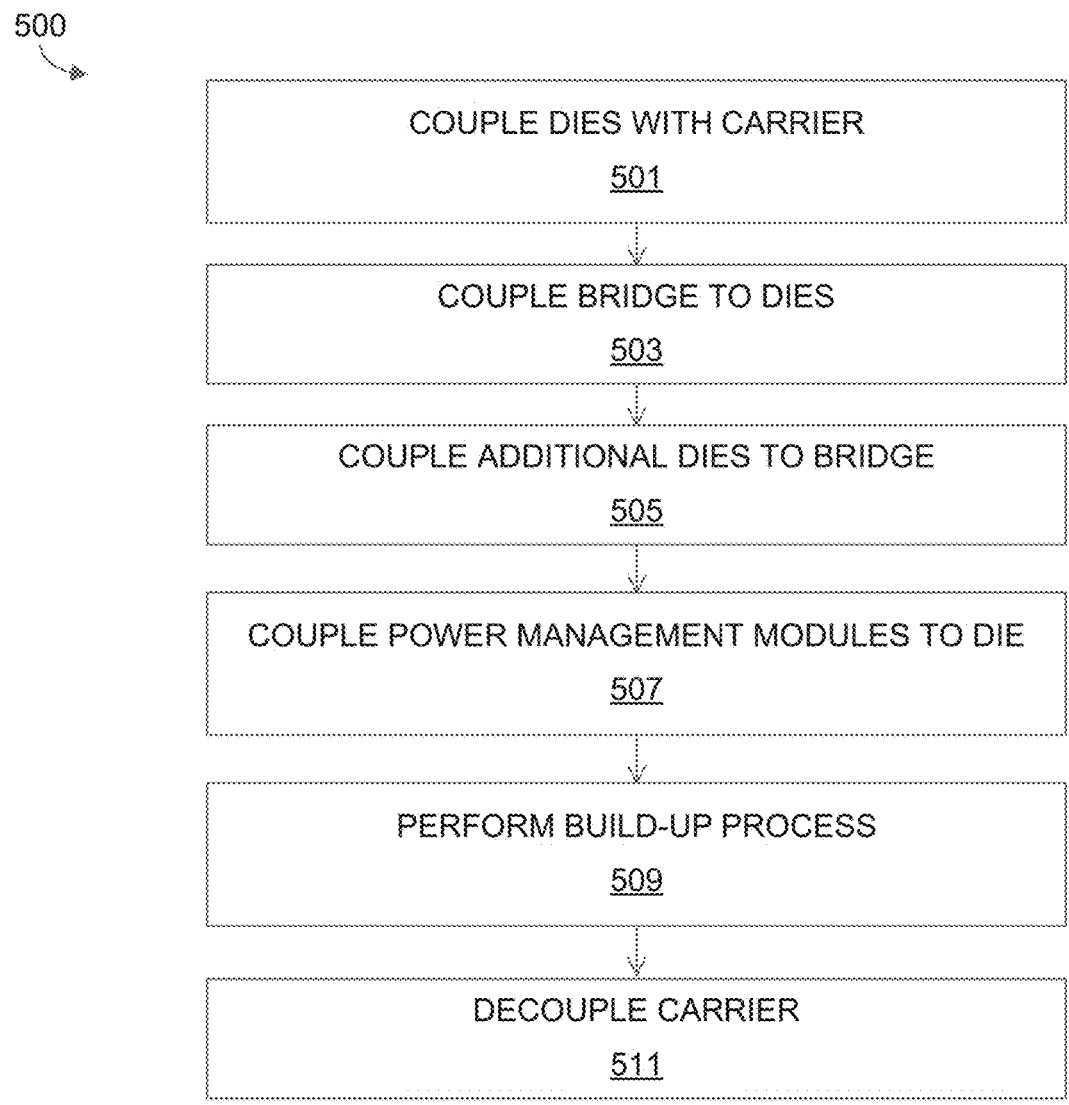
FIG. 5 is an illustrative flow diagram of another integrated circuit package fabrication process in accordance with some embodiments of the present disclosure.
Figure 6:
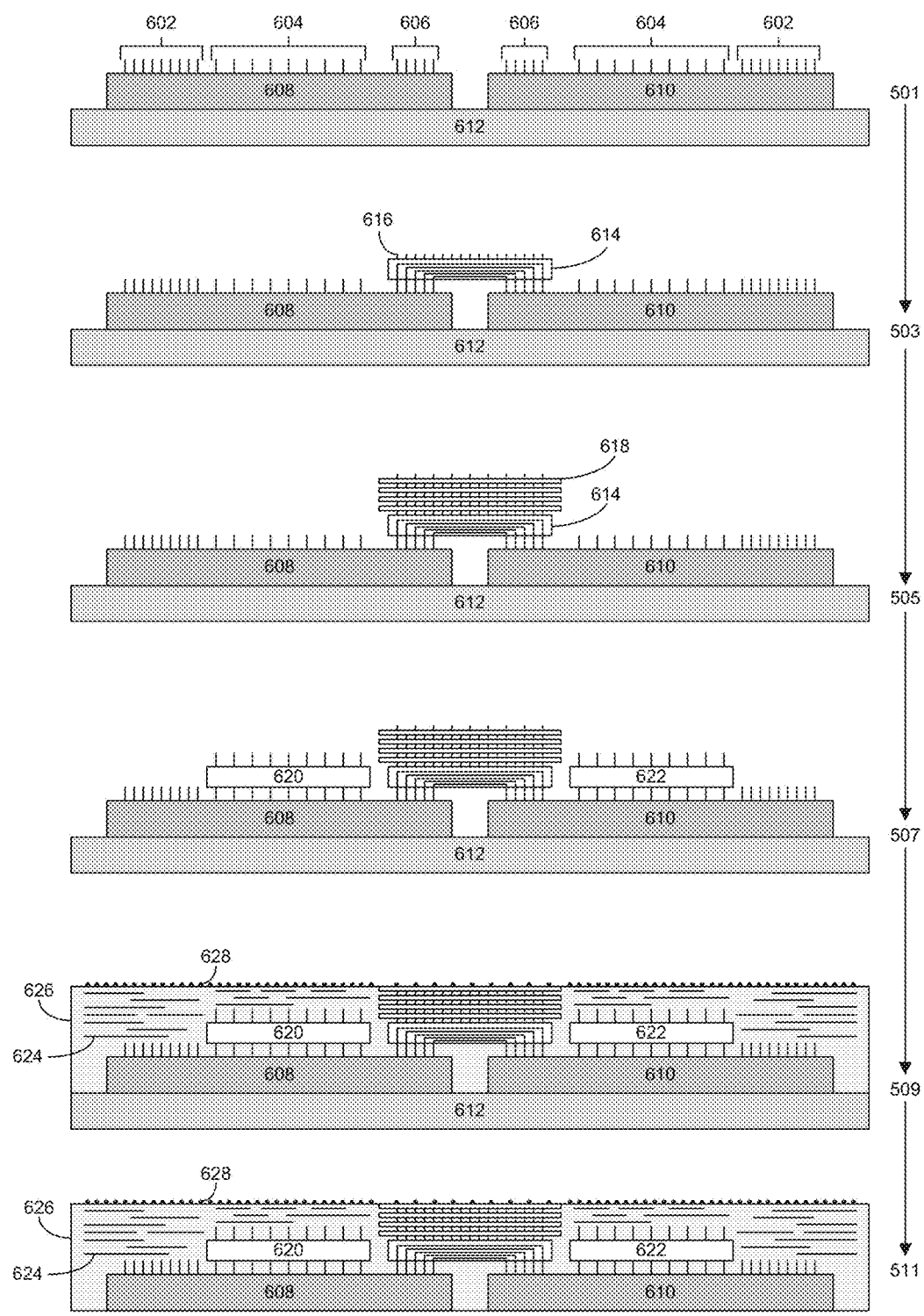
FIG. 6 is an illustrative cross-sectional view of selected operations illustrating stages in the integrated circuit package fabrication process described in FIG. 5, in accordance with some embodiments of the present disclosure.

In some embodiments, as discussed further in reference to FIGS. 5 and 6, bridge 310 may have additional routing features disposed on a side opposite the routing features discussed above. For reference, this would be the top side of bridge 310 depicted in FIGS. 3 and 4. These additional routing features may be configured to attach to and route signals to and from one or more additional dies (not depicted). In addition, these additional routing features may be configured to route signals to the side opposite these additional routing features. For example, these additional routing features may be configured to route signals between the one or more additional dies and dies 304 and/or 306. Bridge 310 may be constructed of material including silicon, glass, reinforced organic with laminated build-up materials, and/or a combination of organic build-up material with glass or silicon substrates. In embodiments where bridge 310 may include silicon, the additional routing features may be through silicon vias (TSVs). In embodiments where bridge 310 may include glass, these additional routing features may be through glass vias (TGVs). In addition, while depicted herein as symmetrical, bridge 310 need not be exactly symmetrical and, in some embodiments, the thickness of the bridge may vary from one die to the next. This variation in thickness may be beneficial, for example, in instances where dies 304 and 306 are of differing thickness a bridge that is asymmetrical may still provide a level surface opposite dies 304 and 306.

In embodiments, bridge 310 may be active or passive. As utilized herein, an active bridge may refer to a bridge having logic integrated therein to carry out one or more logical functions. These logical functions may, in some embodiments, modify, adjust, or dynamically route the signals as they are transmitted. A passive bridge, on the other hand, may not have logic integrated therewith and may merely provide static routing of the signals. In embodiments, a passive bridge may include passives such as, for example, capacitors, inductors, resistors, or any combination thereof. In embodiments where the bridge 310 is active the bridge 310 may operate as a memory controller or other like controller. In some embodiments, bridge 310 may be a thin compliant bridge that may be flexible enough to compensate when the dies may not be coplanar.

At operation 205 dies 304 and 306, along with bridge 310 may be encapsulated in an electrically insulating material 312 such as a molding compound or underfill material. At operation 207 excess electrically insulating material 312 may be removed. In some embodiments, all of the excess material may be removed revealing a side of the bridge. In other embodiments, for example where the bridge has additional routing features opposite those connected to dies 304 and 306, some of the excess material may remain and vias may be formed in the material to allow for connections to be made with the additional routing features.

At operation 209 vias 314 may be formed in the electrically insulating material 312 to allow for connection to be made with additional die interconnect structures (e.g., those not coupled with bridge 310). In some embodiments, as depicted, the vias may be coplanar with bridge 310. In some embodiments, at operation 211 the carrier 308 may be decoupled from the IC package revealing a planar side configured to have a heat spreader attached therewith. In other embodiments, the carrier 308 may be left as part of the package, for example, in a case where the carrier 308 takes the form of a heat spreader.

FIG. 4 is an illustrative cross-sectional view of an integrated circuit (IC) package according to some embodiments of the present disclosure. As depicted, the package is similar to the package of FIG. 3 formed through the process depicted in FIG. 2. In this embodiment, rather than the die interconnect structures being a uniform length, the die has bridge interconnect structures 404 that couple with bridge 310 and die interconnect structures 402 exposed in the surface of the electrically insulating material without the need for vias formed in the electrically insulating material. In such embodiments, as depicted here, the die interconnect structures 402 may be made longer to account for the thickness of the bridge. In other embodiments, the bridge interconnect structures 404 may be selectively made short (not depicted) to account for the thickness of bridge 310. In still further embodiments, the bridge interconnect structures 404 may be made short in combination with a lengthening of the die interconnect structures 402 to accomplish the same effect.

FIG. 5 is another illustrative flow diagram of an integrated circuit package fabrication process in accordance with some embodiments of the present disclosure. FIG. 6 provides cross-sectional views of selected operations illustrating stages in the IC package substrate fabrication process 500, in accordance with an illustrative embodiment. As a result, FIG. 5 and FIG. 6 will be described in conjunction with one another. To aid in this description, the operations performed in FIG. 5 are referenced on the arrows moving from operation to operation in FIG. 6. In addition, not all reference numbers are depicted in each operation in FIG. 6.

Process 500 may begin at operation 501 where two or more dies (e.g., dies 608 and 610 of FIG. 6) may be coupled with a carrier (e.g., carrier 612 of FIG. 6). The dies 608 and 610 may be coupled with the carrier 612 by way of a bonding material (not depicted), such as, for example, an adhesive, resin, or solder. An adhesive may be any type of die bonding adhesive, such as an epoxy adhesive. In some embodiments, an adhesive may include metal particles suspended in the adhesive to provide for thermal and or electrical conductivity. A resin may be, for example, a polyimide based resin or a thermoplastic. In embodiments utilizing a solder, the solder may include, for example, lead (Pb), gold (Au), silver (Ag), tin (Sn), or any combination thereof. In some embodiments, the material bonding the dies 608, 610 to the carrier 612 may be selected to make debonding of the dies 608, 610 from the carrier 612 more easily accomplished than with other materials.

In embodiments, carrier 612 may be a metal carrier configured to perform as a heat spreader for the IC package. Such a metal carrier may be selected based upon the material's thermal conductivity and may include any material capable of allowing sufficient heat transfer away from the dies to allow the dies to maintain an operational temperature during operation. For example, the metal carrier may be made at least in part of copper or copper alloy, aluminum or aluminum alloy, AlSiC (aluminum matrix with silicon carbide particles), diamond, copper-tungsten pseudoalloy, Dymalloy. In other embodiments, the carrier may be selected due to its coefficient of expansion to reduce or minimize expansion differences in the process flow. In such embodiments, the carrier may be, for example, a glass or ceramic carrier.

In some embodiments, die 608 or 610 may be coupled with the carrier 612 prior to the other die being coupled with the carrier 612. In such embodiments, the second die (e.g., die 610) may be coupled with the carrier in a location with respect to the location of the first die (e.g., die 608) coupled with the carrier 612. Dies 608 and 610 may each represent a discrete chip made from a semiconductor material. Such dies 608 and 610 may be, include, or be a part of a processor, memory, or ASIC in some embodiments. While only two dies are depicted, this is merely for clarity and any suitable number of dies may be coupled with the carrier without departing from the scope of this disclosure.

As depicted, dies 608 and 610 may have multiple sets of input/output (I/O) interconnect structures. Each die may have bridge interconnect structures 606 configured to attach electrically and physically with a bridge. Each die may further have power management interconnect structures 604 configured to attach electrically and physically with power management modules. In addition, each die may have die interconnect structures 602 configured to electrically couple with a package substrate or circuit board. Each of these sets of I/O interconnect structures are discussed in greater detail below.

In operation 503 a bridge (e.g., bridge 614 of FIG. 6) may be attached to dies 608 and 610. The electrical routing features of bridge 614 may be configured to attach to bridge interconnect structures 606 of dies 608 and 610 according to a variety of suitable configurations including, a flip-chip configuration. In the flip-chip configuration, bridge 614 may be attached to one or both of dies 608 or 610 via various interconnect structures, such as bumps, pillars, or other suitable structures that may also electrically couple bridge 614 with dies 608 and 610. In embodiments where more than two dies are utilized, the electrical routing features of the bridge 614 may be configured to attach to and route signals to and from each additional die in addition to the signal routed to and from dies 608 and 610.

In some embodiments, bridge 614 may have additional routing features 616 disposed on a side opposite the routing features discussed above. Additional routing features 616 may be configured to attach to and route signals to and from one or more additional dies. In addition, additional routing features 616 may be configured to route signals to and from the side of the bridge opposite additional routing features 616. For example, additional routing features 616 may be configured to route signals between dies to dies 608 and 610. In some embodiments, additional routing features 616 may be through silicon vias (TSVs).

In embodiments, bridge 614 may be active or passive. As utilized herein, an active bridge may refer to a bridge having logic integrated therein to carry out one or more logical functions. These logical functions may, in some embodiments, modify or adjust the signals or dynamically route the signal as they are transmitted. A passive bridge, on the other hand, may not have logic integrated therewith and may merely provide static routing of any signals. In embodiments where the bridge 614 is active the bridge 614 may operate as a memory controller or other like controller.

At operation 505, additional routing features 616 may be coupled with one or more additional dies 618. Additional dies 618 may include active or passive dies, or any combination thereof. In embodiments, additional dies 618 may include one or more dies configured as a memory. In such embodiments, dies 618 may form a memory stack or memory cube. In some embodiments, as discussed above, bridge 614 may contain logic to carry out functions of a memory controller. In other embodiments, bridge 614 may be a passive bridge and one of the additional dies 618 may be an active die configured to operate as a memory controller. At operation 507, power management interconnect structures 604 may be coupled with power management modules 620 and 622 configured to manage power supplied to dies 608 and 610. In some embodiments, power management modules 620 and 622 may include one or more passives such as, for example, capacitors, inductors, resistors, or any combination thereof, encompassed in a molding material.

At operation 509 dies 608 and 610, bridge 614, additional dies 618 and power management modules 608 and 610 may be encapsulated in an electrically insulating material 626 such as a molding compound or underfill material. In other embodiments, encapsulation may be accomplished utilizing build-up layers, such as through a bumpless build-up layer process. In such embodiments, one or more metal features 624 may be embedded in the build-up layers to route electrical signals between dies 608 and 610 and surface level package interconnect structures 628. In some embodiments, at operation 511 carrier 612 may be decoupled from the IC package revealing a planar side configured to couple with a heat spreader. In other embodiments, the carrier 612 may be left as part of the package, for example, in a case where the carrier 612 takes the form of a heat spreader.

Figure 7:
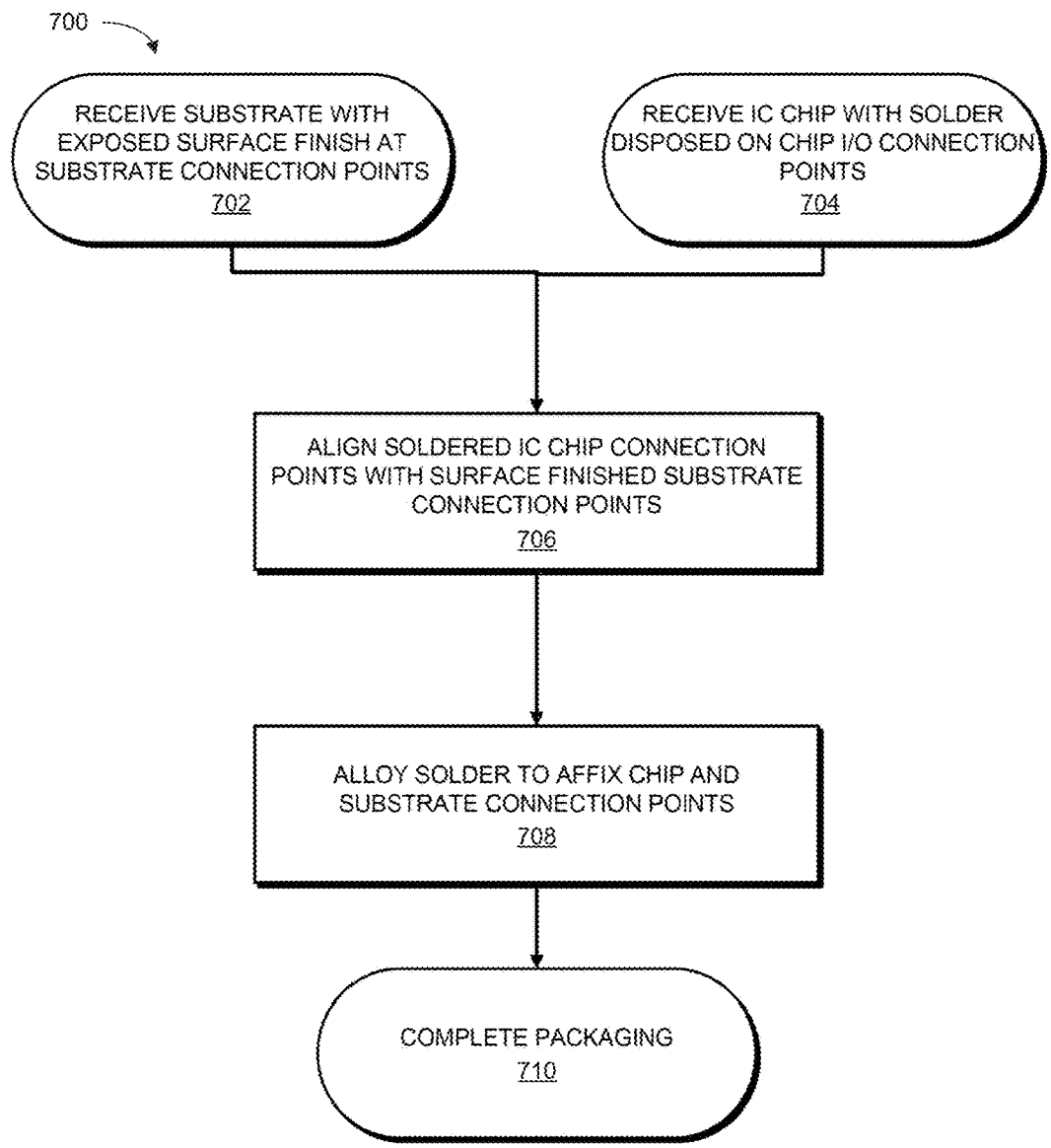
FIG. 7 is an illustrative flow diagram of an assembly process utilizing an integrated circuit package in accordance with an embodiment of the present disclosure.

FIG. 7 is an illustrative flow diagram of an assembly process utilizing an IC package in accordance with embodiments of the present disclosure. Such an IC package may be produced through the illustrative methods described in reference to either of FIG. 2 or 5, above, and may be depicted in FIG. 3, 4 or 6.

Assembly process 700 may begin at operation 702 where a package substrate with exposed surface finish at predetermined substrate connection points may be received. As such, in the illustrative embodiments, no solder resist may be present on the surface of the package substrate and no solder may be placed on the surface finish prior to coupling an IC package to the package substrate.

At operation 704, an IC package may be received with solder bumps disposed on package connection points. In embodiments, the IC package may be any of the IC packages depicted in FIG. 3, 4 or 6, above. At operation 706, the connection points of the IC package may be aligned with the connection points of the substrate. The IC package solder may then be alloyed at operation 708 to affix the IC package to the substrate connection points which may complete the packaging 710.

Figure 8:
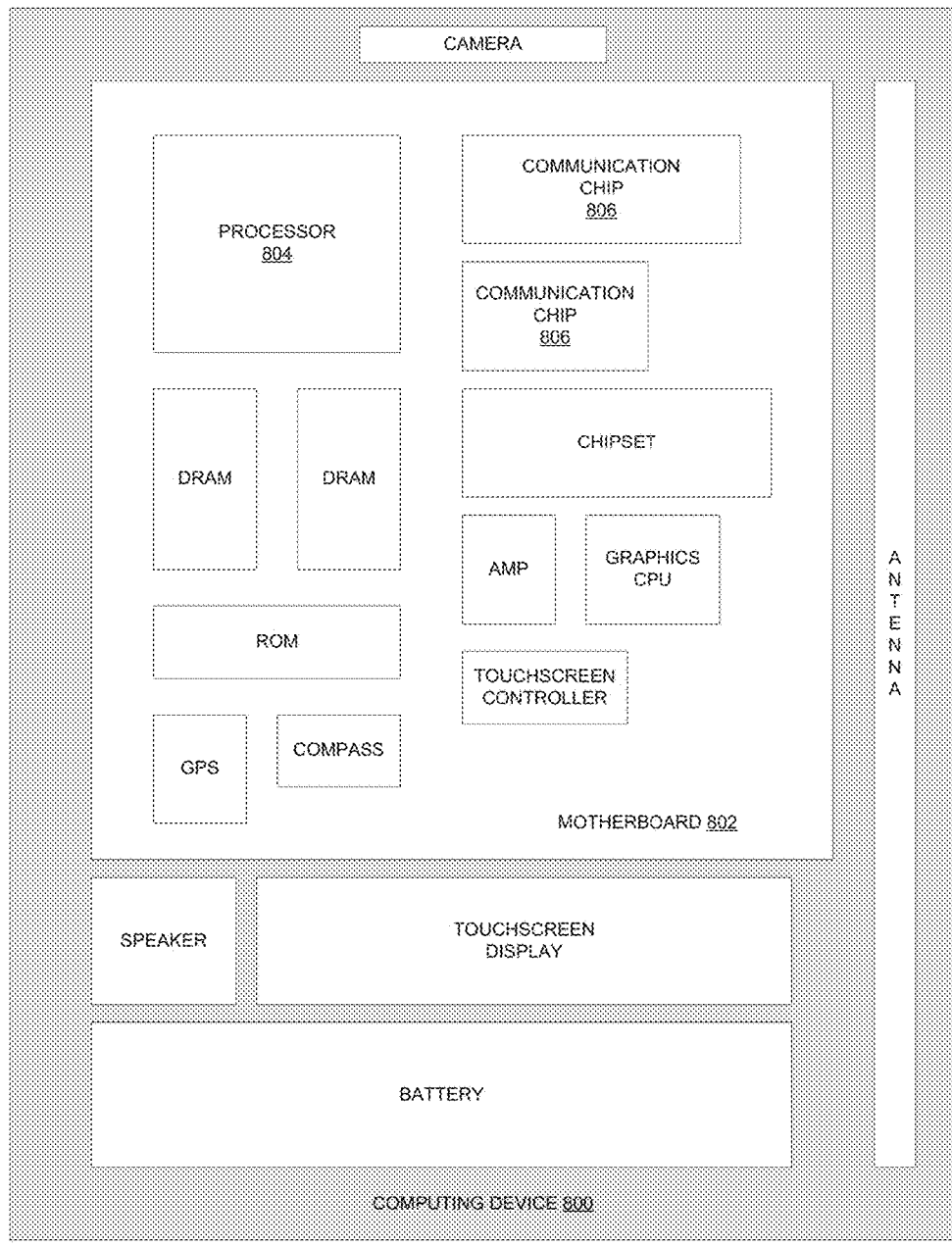
FIG. 8 schematically illustrates a computing device that includes an integrated circuit package, in accordance with some embodiments of the present disclosure.

Embodiments of the present disclosure may be implemented into a system using any suitable hardware and/or software to configure as desired. FIG. 8 schematically illustrates a computing device that includes an IC package as described herein, such as that depicted by FIG. 3, 4 or 6, in accordance with some embodiments. The computing device 800 may house a board such as motherboard 802. The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 may be an IC package (e.g., IC package 108) incorporated into an IC assembly (e.g., IC assembly 100 of FIG. 1). For example, the circuit board 116 of FIG. 1 may be a motherboard 802 and the processor 804 may be an IC package 108 mounted on a package substrate 104 as described herein. The package substrate 104 and the motherboard 802 may be coupled together using package-level interconnects as described herein. The term "processor" may refer to any device or portion of a device that processes electronic data from registers and/or memory to transform that electronic data into other electronic data that may be stored in registers and/or memory.

The communication chip 806 may be an IC package (e.g., IC package 108) incorporated into an IC assembly (e.g., IC package 108) that includes a package substrate 104. In further implementations, another component (e.g., memory device or other integrated circuit device) housed within the computing device 800 may be an IC package (e.g., IC package 108) incorporated into an IC assembly (e.g., IC assembly 100 of FIG. 1).

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

EXAMPLES

According to various embodiments, the present disclosure describes a number of examples. Example 1 is an integrated circuit package comprising: a first die and a second die having a first and second plurality of input/output (I/O) interconnect structures, respectively; and a bridge comprising: first electrical routing features electrically coupled to a portion of the first plurality of I/O interconnect structures; second electrical routing features electrically coupled to a portion of the second plurality of I/O interconnect structures, the first and second electrical routing features disposed on a first side of the bridge; and third electrical routing features disposed on a second side of the bridge, opposite the first side, wherein the first electrical routing features and the second electrical routing features are configured to route electrical signals between the first die and the second die and the third electrical routing features are configured to route electrical signals between the second side and the first side, and wherein the first die, the second die, and the bridge are at least partially embedded in electrically insulating material.

Example 2 may include the subject matter of Example 1, wherein the bridge further comprises through silicon vias (TSVs) coupled with the third electrical routing features and configured to route electrical signals between the second side and the first side.

Example 3 may include the subject matter of Example 2, further comprising a third die having a third plurality of I/O interconnect structures bonded to the third electrical routing features, wherein the third die is also embedded in the electrically insulating material.

Example 4 may include the subject matter of Example 3, wherein the third die further comprises a fourth plurality of I/O interconnect structures configured to bond with I/O interconnect structures of a fourth die.

Example 5 may include the subject matter of Example 3, wherein the bridge is an active bridge having one or more logic features embedded therein.

Example 6 may include the subject matter of Example 2, further comprising a memory die stack having a plurality of dies wherein the memory die stack is bonded to the bridge via the third electrical routing features and wherein the bridge is an active bridge configured to perform one or more functions of a memory controller, and wherein the memory die stack is also embedded in the electrically insulating material.

Example 7 may include the subject matter of any one of Examples 1-6, further comprising a first power management module and a second power management module, wherein the first die and the second die further comprise first power interconnect structures and second power interconnect structures respectively, and wherein the first power management module is bonded to the first die via the first power interconnect structures and the second power management module is bonded to the second die via the second power interconnect structures, and wherein the first and second power management modules are also embedded in the electrically insulating material.

Example 8 may include the subject matter of any one of Examples 1-6, further comprising a plurality of vias coupled with the first and second plurality of input/output (I/O) interconnect structures, wherein the vias are disposed in the electrically insulating material and are coplanar with the bridge.

Example 9 may include the subject matter of any one of Examples 1-6, wherein the electrically insulating material comprises a plurality of build-up layers of electrically insulating material having one or more metal features embedded therein and configured to route I/O signals through the electrically insulating material.

Example 10 may include the subject matter of any one of Examples 1-6, further comprising a heat spreader coupled with a first and second surface of the first and second dies, respectively, wherein the heat spreader forms one side of the integrated circuit package.

Example 11 may include the subject matter of any one of Examples 1-6, wherein the electrically insulating material and a first and second surface of the first and second dies, respectively, form a planar surface of the integrated circuit package configured to integrate with a heat spreader.

Example 12 may include the subject matter of any one of Examples 1-6, wherein one or more of the first or second plurality of I/O interconnect structures have at least one surface level connection point coplanar with a surface of the electrically insulating material to allow the integrated circuit package to physically and electrically connect to one of a substrate or a circuit board.

Example 13 may include the subject matter of Example 12, wherein the at least one surface level connection point is a via structure formed in the electrically insulating material.

Example 14 may include the subject matter of Example 12, wherein the portion of the first plurality of I/O interconnect structures and the portion of the second plurality of I/O interconnect structures are shorter than the one or more of the first or second plurality of I/O interconnect structures, such that the first and second plurality of I/O interconnect structures have bonding surfaces that are coplanar with a surface of the bridge and a surface of the electrically insulating material.

Example 15 is a method of assembling an integrated circuit package comprising: coupling a first die to a bridge by bonding a portion of a first plurality of input/output (I/O) interconnect structures disposed on the first die to a first plurality of electrical routing features disposed on the bridge; coupling a second die to the bridge by bonding a portion of a second plurality of I/O interconnect structures disposed on the second die to a second plurality of electrical routing features disposed on the bridge, wherein the first and second plurality of electrical routing features are disposed on a first side of the bridge, and wherein the bridge has a third plurality of routing features disposed on a second side, opposite the first side, configured to route electrical signals between the second side and the first side; and depositing an electrically insulating material over the first die, the second die, and the bridge to at least partially embed the first die, the second die, and the bridge in the electrically insulating material.

Example 16 may include the subject matter of Example 15, further comprising coupling the first die and the second die to a carrier prior to the coupling of the first die and second die to the bridge.

Example 17 may include the subject matter of Example 16, wherein the carrier is a heat spreader.

Example 18 may include the subject matter of any one of Examples 15-17, further comprising coupling a die stack with the bridge by bonding a third plurality of I/O interconnect structures of the die stack to the third electrical routing features disposed on the bridge.

Example 19 may include the subject matter of any one of Examples 15-17, wherein depositing an electrically insulating material further comprises performing a bumpless build-up layer process to embed metal features within the electrically insulating material configured to route I/O signals through the electrically insulating material.

Example 20 may include the subject matter of any one of Examples 15-17, further comprising laser drilling vias in a surface of the electrically insulating material to reveal one or more of the first plurality of I/O interconnect structures or one or more of the second plurality of I/O interconnect structures.

Example 21 is a package assembly comprising: an integrated circuit (IC) package including: a first die and a second die having a first and second plurality of input/output (I/O) interconnect structures, respectively; and a bridge comprising first electrical routing features electrically coupled to a portion of the first plurality of I/O interconnect structures; second electrical routing features electrically coupled to a portion of the second plurality of I/O interconnect structures, the first and second electrical routing features disposed on a first side of the bridge; and third electrical routing features disposed on a second side, opposite the first side, wherein the first electrical routing features and the second electrical routing features are configured to route electrical signals between the first die and the second die and the third electrical routing features are configured to route electrical signals, at least in part, between the second side and the first side, and wherein the first die, the second die, and the bridge are at least partially embedded in electrically insulating material; and a package substrate including a first side having one or more lands disposed thereon; and a second side disposed opposite to the first side, the second side having one or more electrical routing features disposed thereon, the electrical routing features electrically coupled with the first plurality of I/O interconnect structures and the second plurality of I/O interconnect structures.

Example 22 may include the subject matter of Example 21, wherein the IC package is a processor.

Example 23 may include the subject matter of Example 22, further comprising one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board, wherein the package assembly is part of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Example 24 is an apparatus for assembling an integrated circuit package comprising: means for coupling a first die to a bridge by bonding a portion of a first plurality of input/output (I/O) interconnect structures disposed on the first die to a first plurality of electrical routing features disposed on the bridge; means for coupling a second die to the bridge by bonding a portion of a second plurality of I/O interconnect structures disposed on the second die to a second plurality of electrical routing features disposed on the bridge, wherein the first and second plurality of electrical routing features are disposed on a first side of the bridge, and wherein the bridge has a third plurality of routing features disposed on a second side, opposite the first side, configured to route electrical signals between the second side and the first side; and means for depositing an electrically insulating material over the first die, the second die, and the bridge to at least partially embed the first die, the second die, and the bridge in the electrically insulating material.

Example 25 may include the subject matter of Example 24, further comprising means for coupling the first die and the second die to a carrier prior to the coupling of the first die and second die to the bridge.

Example 26 may include the subject matter of Example 25, wherein the carrier is a heat spreader.

Example 27 may include the subject matter of any one of Examples 24-26, further comprising means for coupling a die stack with the bridge by bonding a third plurality of I/O interconnect structures of the die stack to the third electrical routing features disposed on the bridge.

Example 28 may include the subject matter of any one of Examples 24-26, wherein means for depositing an electrically insulating material further comprises means for performing a bumpless build-up layer process to embed metal features within the electrically insulating material configured to route I/O signals through the electrically insulating material.

Example 29 may include the subject matter of any one of Examples 24-26, further comprising means for laser drilling vias in a surface of the electrically insulating material to reveal one or more of the first plurality of I/O interconnect structures or one or more of the second plurality of I/O interconnect structures.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit package comprising:
   a first die and a second die having a first and a second plurality of input/output (I/O) interconnect structures, respectively, and first power interconnect structures and second power interconnect structures, respectively; and
   a bridge comprising:
      first electrical routing features on a first side of the bridge electrically coupled to the first plurality of I/O interconnect structures and the second plurality of I/O interconnect structures;
      second electrical routing features disposed on a second side of the bridge, opposite the first side of the bridge; and
      through silicon vias (TSVs) to couple the first routing features and the second routing features, wherein the first electrical routing features are to route electrical signals between the first die and the second die; and
   a first power management module and a second power management module, wherein the first power management module is bonded to the first die via the first power interconnect structures and the second power management module is bonded to the second die via the second power interconnect structures.

2. The integrated circuit package of claim 1, further comprising a third die having a third plurality of I/O interconnect structures bonded to the second electrical routing features, wherein the third die is embedded in an electrically insulating material.

3. The integrated circuit package of claim 2, wherein the third die further comprises a fourth plurality of I/O interconnect structures to bond with I/O interconnect structures of a fourth die.

4. The integrated circuit package of claim 2, wherein the bridge is an active bridge having one or more logic features embedded therein.

5. The integrated circuit package of claim 1, further comprising a memory die stack having a plurality of dies wherein the memory die stack is bonded to the bridge via the second electrical routing features and wherein the bridge is an active bridge to perform one or more functions of a memory controller, and wherein the memory die stack is embedded in an electrically insulating material.

6. The integrated circuit package of claim 1, further comprising a plurality of vias coupled with the first and second plurality of input/output (I/O) interconnect structures, wherein the vias are disposed in an electrically insulating material and are coplanar with the bridge.

7. The integrated circuit package of claim 1, wherein an electrically insulating material comprises a plurality of build-up layers of electrically insulating material having one or more metal features embedded therein and to route I/O signals through the electrically insulating material.

8. The integrated circuit package of claim 1, further comprising a heat spreader coupled with a first and second surface of the first and second dies, respectively, wherein the heat spreader forms one side of the integrated circuit package.

9. The integrated circuit package of claim 1, wherein an electrically insulating material and a first and second surface of the first and second dies, respectively, form a planar surface of the integrated circuit package to integrate with a heat spreader.

10. The integrated circuit package of claim 1, wherein one or more of the first or second plurality of I/O interconnect structures have at least one surface level connection point coplanar with a surface of an electrically insulating material to allow the integrated circuit package to physically and electrically connect to one of a substrate or a circuit board.

11. The integrated circuit package of claim 10, wherein the at least one surface level connection point is a via structure formed in an electrically insulating material.

12. The integrated circuit package of claim 10, wherein a portion of the first plurality of I/O interconnect structures and a portion of the second plurality of I/O interconnect structures are shorter than the one or more of the first or second plurality of I/O interconnect structures, such that the first and second plurality of I/O interconnect structures have bonding surfaces that are coplanar with a surface of the bridge and a surface of an electrically insulating material.

13. The integrated circuit package of claim 1, wherein the second electrical routing features are a redistribution layer (RDL).

14. The integrated circuit package of claim 1, wherein the first electrical routing features are an RDL.

15. The integrated circuit package of claim 1, wherein the first and second power management modules are embedded in an electrically insulating material.

16. A package assembly comprising:
  an integrated circuit (IC) package including:
    a first die and a second die having a first and a second plurality of input/output (I/O) interconnect structures, respectively, and first power interconnect structures and second power interconnect structures, respectively;
    a first power management module and a second power management module, wherein the first power management module is bonded to the first die via the first power interconnect structures and the second power management module is bonded to the second die via the second power interconnect structures; and
    a bridge comprising:
      first electrical routing features on a first side of the bridge electrically coupled to the first plurality of I/O interconnect structures and the second plurality of I/O interconnect structures;
      second electrical routing features disposed on a second side of the bridge, opposite the first side of the bridge; and
      through silicon vias (TSVs) to couple the first routing features and the second routing features, wherein the first electrical routing features are to route electrical signals between the first die and the second die; and
    a package substrate including a first side having one or more lands disposed thereon; and a second side disposed opposite to the first side, the second side having one or more electrical routing features disposed thereon, the electrical routing features electrically coupled with the first plurality of I/O interconnect structures and the second plurality of I/O interconnect structures.

17. The package assembly of claim 16, wherein the IC package is a processor.

18. The package assembly of claim 16, further comprising one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board, wherein the package assembly is part of a laptop, a netbook, a notebook, an Ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

19. The package assembly of claim 16, wherein the first and second power management modules are embedded in an electrically insulating material.

* * * * *